United States Patent
Sekine

(10) Patent No.: US 9,735,074 B1
(45) Date of Patent: Aug. 15, 2017

(54) SEMICONDUCTOR DEVICE

(71) Applicant: NAPRA CO., LTD., Katsushika-ku, Tokyo (JP)

(72) Inventor: Shigenobu Sekine, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

(21) Appl. No.: 15/419,155

(22) Filed: Jan. 30, 2017

(30) Foreign Application Priority Data

Feb. 16, 2016 (JP) .................................. 2016-027263

(51) Int. Cl.
| | | |
|---|---|---|
| *H01L 23/28* | (2006.01) | |
| *H01L 23/29* | (2006.01) | |
| *H01L 23/31* | (2006.01) | |
| *H01L 23/10* | (2006.01) | |
| *H01L 23/04* | (2006.01) | |
| *H01L 23/367* | (2006.01) | |
| *H01L 23/535* | (2006.01) | |

(52) U.S. Cl.
CPC .............. *H01L 23/10* (2013.01); *H01L 23/04* (2013.01); *H01L 23/3675* (2013.01); *H01L 23/535* (2013.01); *H01L 23/28* (2013.01); *H01L 23/29* (2013.01); *H01L 23/295* (2013.01); *H01L 23/298* (2013.01); *H01L 23/3107* (2013.01); *H01L 23/3114* (2013.01); *H01L 23/3142* (2013.01)

(58) Field of Classification Search
CPC ....... H01L 23/28; H01L 23/29; H01L 23/295; H01L 23/298; H01L 23/3107; H01L 23/3114; H01L 23/3142
See application file for complete search history.

(56) References Cited

U.S. PATENT DOCUMENTS

| | | | |
|---|---|---|---|
| 7,012,332 B2 | 3/2006 | Hori et al. | |
| 2003/0114550 A1* | 6/2003 | Toyota | C08G 18/4072 521/155 |
| 2003/0218258 A1* | 11/2003 | Charles | H01L 21/563 257/783 |
| 2010/0244286 A1* | 9/2010 | Lagsa | B82Y 30/00 257/789 |
| 2014/0147578 A1* | 5/2014 | Sekine | H01B 3/18 427/58 |
| 2016/0002510 A1* | 1/2016 | Champagne | C08K 5/092 257/734 |

FOREIGN PATENT DOCUMENTS

| | | |
|---|---|---|
| JP | 2004-134623 A | 4/2004 |
| JP | 2011-080796 A | 4/2011 |
| JP | 5281188 B1 | 9/2013 |
| JP | 2015-207636 A | 11/2015 |

* cited by examiner

*Primary Examiner* — David Zarneke
(74) *Attorney, Agent, or Firm* — Carrier Blackman & Associates, P.C.; William D. Blackman; Joseph P. Carrier

(57) ABSTRACT

Disclosed is a semiconductor device that is configured to contain a sealing layer for sealing a semiconductor element supported on a base, the sealing layer being configured to have a nanocomposite structure that comprises a large number of nanometer-sized (1 μm or smaller) insulating nanoparticles composed of $SiO_2$, and an amorphous silica matrix that fills up the space around the insulating nanoparticles without voids and gaps.

2 Claims, 2 Drawing Sheets

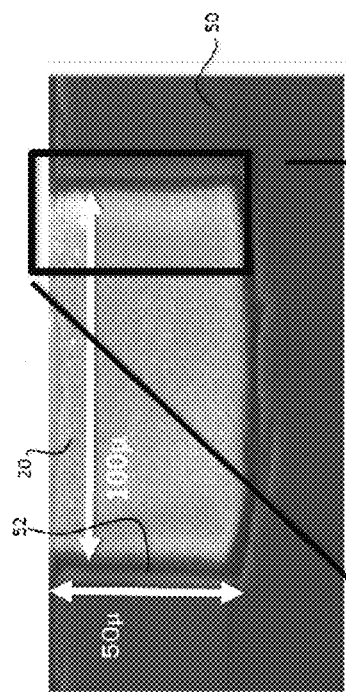
FIG. 2A
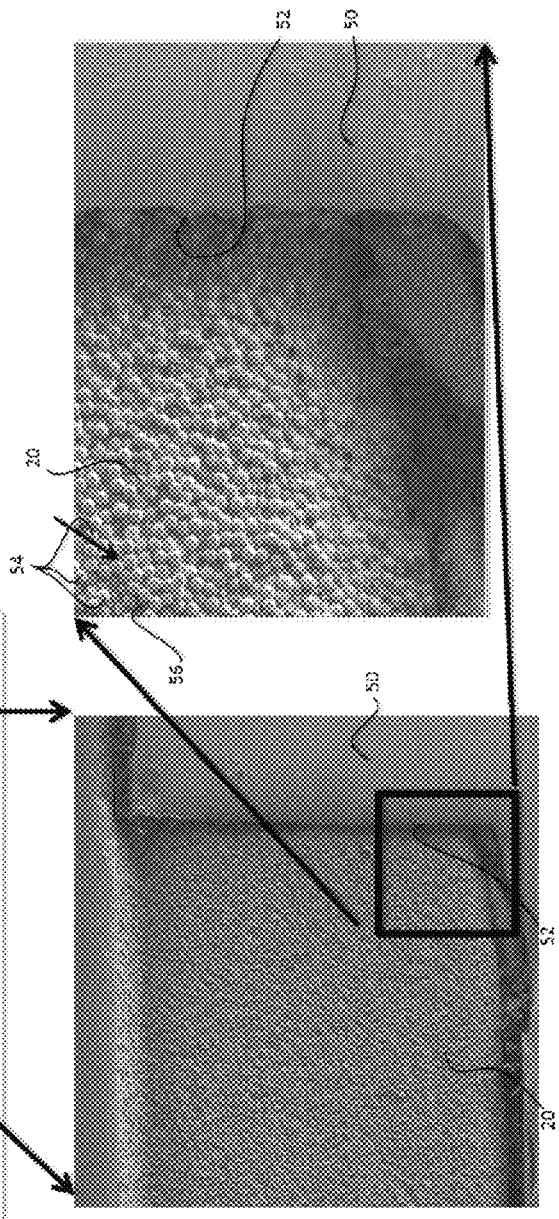
FIG. 2B
FIG. 2C

SEMICONDUCTOR DEVICE

INCORPORATION BY REFERENCE

This application is based on Japanese Patent Application No. 2016-27263, filed on Feb. 16, 2016, the content of which is incorporated hereinto by reference.

BACKGROUND OF THE INVENTION

1. Field of the Invention

This invention relates to a semiconductor device.

2. Description of the Related Art

Development of SiC semiconductor element using SiC (silicon carbide) has been promoted in recent years.

The SiC semiconductor element has attracted public attention as a power device that controls large electric power, by virtue of its higher breakdown field than that of Si semiconductor element, and its wider band gap. The SiC semiconductor element can operate at temperatures as high as 150° C. or above at which Si semiconductor element cannot endure, and is reportedly operable even at 500° C. or above on the theoretical basis (see JP-A-2011-80796).

By the way, the semiconductor elements are used in the form of semiconductor device while housed in a case for protection, and sealed by a sealing layer that is composed of a resin sealing material filled up in the case.

At present, the sealing layer composed of a resin sealing material is durable only in the temperature range up to 150° C., and can degrade and produce therein a void above 150° C. where the SiC semiconductor element can operate. This is disadvantageous in terms of keeping the semiconductor device durable enough.

There has therefore been no choice but to use the SiC semiconductor element so that the operating temperature will not exceed the heat resistance temperature of the sealing layer, and this has prevented the SiC semiconductor element from fully demonstrating the performances.

Such SiC semiconductor element has been used as a power device in a booster circuit for boosting DC voltage; or in a power changing circuit such as an inverter circuit for changing DC voltage into AC voltage, and a converter circuit for changing AC voltage into DC voltage.

For example, railway vehicles include those supplied with DC power for running and those supplied with AC power for running. Both of them have an inverter for controlling AC power to be fed to a traveling motor, and for this inverter, the power device is used.

Since, as described above, the heat resistant temperature of the sealing layer made of a resin sealing material is as high as 150° C. or below at present, so that the power device for the inverter, when operated at above 150° C. as the railway vehicle travels, tends to break down due to degradation of the sealing layer.

Most of recent railway vehicle accidents are caused by such failure of the power device due to degradation of the sealing layer under elevated operating temperature. Repair of the power device needs a great deal of labor and cost. The situation therefore needs some improvement.

This sort of failure of the power device under elevated operating temperature has also occurred in electric vehicles having the inverter for driving a traveling motor, or in power generating facilities using the inverter for changing solar-generated DC power into utility AC power, and has been desired to be improved.

Meanwhile, in JP-B1-5281188 granted to the present applicant, there have been proposed insulating materials excellent in physical/chemical strength.

SUMMARY OF THE INVENTION

This inventors found that the above-described insulating material has not only excellent physical/chemical properties, but also a heat resistance temperature exceeding 250° C.

This invention is conceived while focusing on the heat resistance of the insulating material, and is to provide a semiconductor device that can remain durable even when operated at high temperatures, and is advantageous enough to allow the semiconductor element to fully demonstrate the performance.

According to this invention aimed at solving the above-described problems, there is provided a semiconductor device that includes a semiconductor element; a case that houses the semiconductor element; a base that supports the semiconductor element inside the case, and functions as a heat radiation member that dissipates heat generated in the semiconductor element; an interconnect member that is provided inside the case, and is electrically connected to the semiconductor element; and a sealing layer that is filled in the case so as to embed the semiconductor element and the interconnect member, the sealing layer being configured to have a nanocomposite structure that contains insulating nanoparticles composed of $SiO_2$ and having a particle size of 1 μm or smaller, and an amorphous silica matrix that fills up the space around the particles without voids and gaps.

BRIEF DESCRIPTION OF THE DRAWINGS

FIG. 2A is an explanatory drawing illustrating a sealing layer 20 formed in a recess 52 provided to an insulating member 50, FIG. 2B is an enlarged view of the rectangular frame portion in FIG. 2A, and FIG. 2C is a further enlarged view of the rectangular frame portion in FIG. 2B.

Figure 1:
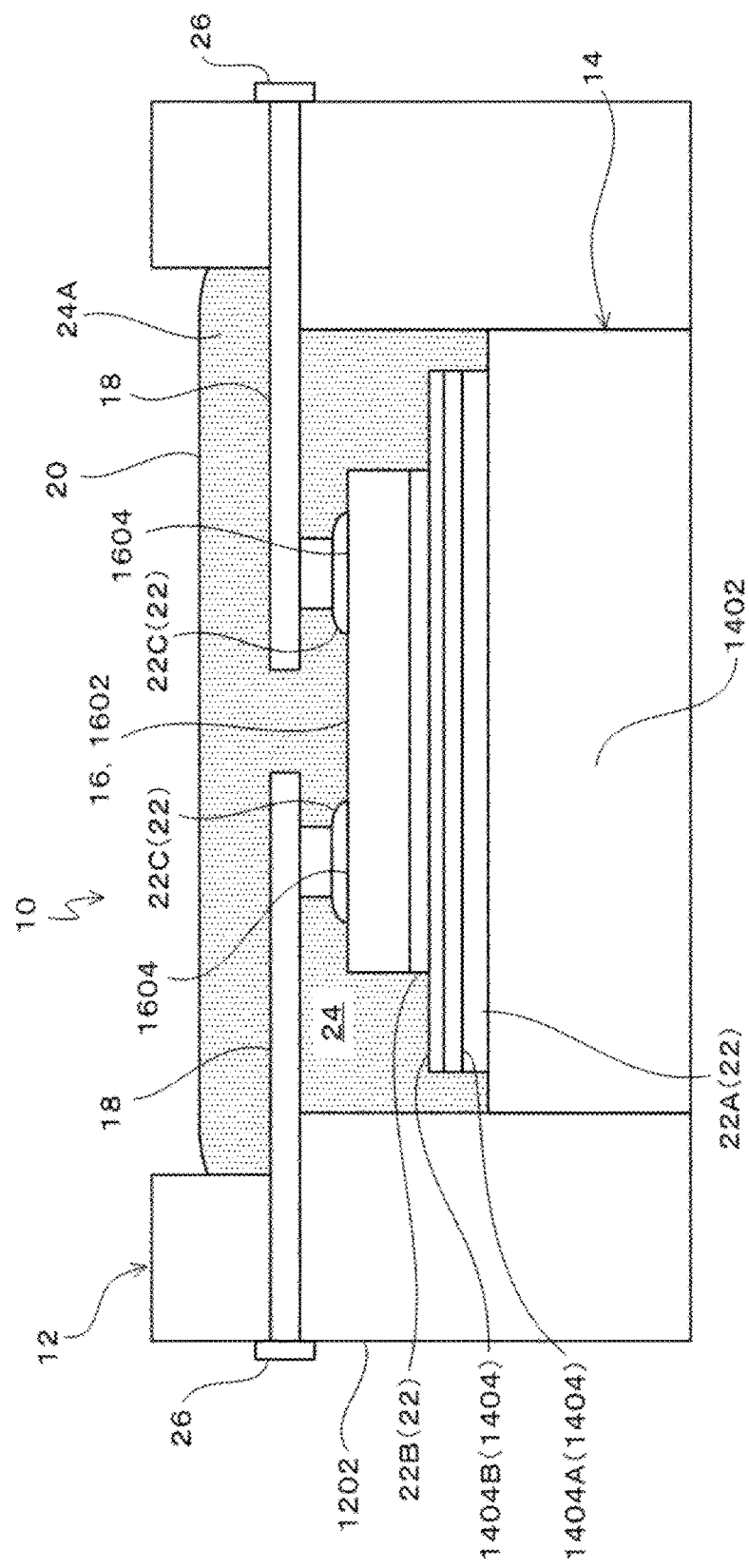
FIG. 1 is a cross-sectional view illustrating a semiconductor device according to one embodiment.

DESCRIPTION OF THE EMBODIMENTS (Structure of Semiconductor Device)

Next, a semiconductor device of this embodiment will be explained referring to the attached drawings.

As illustrated in FIG. 1, a semiconductor device 10 is configured to contain a case 12, a base 14, a semiconductor element 16, interconnect members 18, a sealing layer 20, and a bonding layer 22.

In this embodiment, each bonding layer 22 is configured to contain not only a third bonding layer 22C that connects electrodes 1604 of the semiconductor element 16 and the interconnect members 18, but also a first bonding layer 22A and a second bonding layer 22B.

The case 12 is configured by a sidewall-like frame member 1202 having an open top and an open bottom, and has a housing space 24 for housing the semiconductor element 16 inside the frame member 1202.

For the case 12, a variety of known materials including non-electroconductive ceramic materials are adoptable.

The base 14 is a member that supports the semiconductor element 16, and is formed using a highly heat-conductive material.

In this embodiment, the base 14 has a base body 1402 and an intermediate plate 1404.

The base body 1402 plugs the open bottom of the sidewall-like frame member 1202.

For the base body 1402, highly heat-conductive ceramic materials or metals are adoptable.

The intermediate plate 1404 is formed with a smaller contour than that of the top face of the base 14.

The intermediate plate 1404 includes a first plate 1404A that is positioned closer to the base body 1402, and bonded to the top face of the base body 1402 while placing the first bonding layer 22A in between; and a second plate 1404B that is formed on the first plate 1404A so as to be integrated therewith.

The first plate 1404A is composed of a highly heat-conductive ceramic material, and the second plate 1404B is composed of a highly heat-conductive metal material.

Note that the structure of the base 14 is not limited to the above-described structure, and may also be composed of a single metal material or a single ceramic material, provided that it can smoothly conduct heat of the semiconductor element 16 and can act efficiently as a heat radiation member for the semiconductor element 16.

The semiconductor element 16 configures a power device that is used in a booster circuit for boosting DC voltage; or in a power changing circuit such as an inverter circuit for changing DC voltage into AC voltage, and a converter circuit for changing AC voltage into DC voltage. The semiconductor element 16 has a switching element that switches a large current, and may additionally has a diode or passive element that are necessary for driving the switching element.

The semiconductor element 16 used in this embodiment is a SiC semiconductor element that is characterized by its higher breakdown field than that of Si semiconductor element, and its wider band gap, and can operate at temperatures as high as 150° C. or above at which any Si semiconductor element cannot endure, and can operate even at 500° C. or above on the theoretical basis.

The semiconductor element 16 is configured on a substrate 1602 that is composed of SiC, wherein the substrate 1602 has formed on the top face thereof a plurality of bonding electrodes 1604.

The plurality of bonding electrodes 1604 include electrodes that are connected to a power source or load external to the semiconductor device 10 and allows a large current to flow therethrough, and electrodes that are connected to a control circuit external to the semiconductor device 10 and allows a driving signal for driving the switching element to transmit therethrough.

The bonding electrodes 1604 are made, for example, of Al, Cu, Ni, Au, Ag, Ti or alloy containing some of them.

The semiconductor element 16 is supported by the base 14, as a result of placing the semiconductor element 16 on the second plate 1404B of the intermediate plate 1404, so as to direct the surface opposite to the bonding electrodes 1604 to the second plate 1404B, while placing the second bonding layer 22B in between.

The interconnect members 18 are provided to every bonding electrode 1604 of the semiconductor element 16, wherein each interconnect member 18 is electrically connected at one end to the bonding electrode 1604 while placing the third bonding layer 22C in between, and at the other end to a connection terminal 26 provided to the exterior of the case 12, after allowed to extend through the frame member 1202.

The connection terminals 26 are connected to a power source or load external to the semiconductor device 10, or to a control circuit external to the semiconductor device 10.

Geometry and arrangement of the connection terminals 26 are freely selectable.

In the housing space 24, there is formed the sealing layer 20 so as to fill up the sealing space 24A in which the semiconductor element 16, the intermediate plate 1404, and the interconnect members 18 are embedded.

In other words, the sealing layer 20 is formed by a sealing material filled up in the case 12, and embeds the semiconductor element 16 that is placed in the housing space 24 and supported by the base 14.

(Structure of Sealing Layer)

Next, the sealing layer 20 that is arranged in the sealing space 24A and embeds the semiconductor element 16 supported on the base 14 will be explained, referring to FIGS. 2A to 2C.

FIG. 2A illustrates the sealing layer that is formed in the recess 52 preliminarily formed in the insulating member 50, FIG. 2B is an enlarged view of the rectangular frame portion in FIG. 2A, and FIG. 2C is a further enlarged view of a rectangular frame portion in FIG. 2B.

As illustrated in FIG. 2C, the sealing layer is configured to have a nanocomposite structure that includes a large number of nanometer-sized (1 μm or smaller) insulating nanoparticles 54 composed of $SiO_2$, and an amorphous silica matrix 56 that fills up the space around the insulating nanoparticles without voids and gaps.

In other words, the sealing layer 20 is configured by a large number of insulating nanoparticles ($SiO_2$) 54, and a reaction product of $SiO_2$ particles (amorphous silica matrix 56).

Again in other words, the sealing layer 20 is configured to have the nanocomposite structure, which is a composite structure including a large number of insulating nanoparticles ($SiO_2$ particles) 54 as an aggregate, and the surrounding Si—O bonds (amorphous silica matrix 56).

The sealing layer 20 contains the amorphous silica matrix 56, which is a vitrified matter of $SiO_2$ and have therein no void, gap, crack or other defects. The sealing layer 20 can therefore be a highly reliable layer that demonstrates a tight adhesiveness to the case 12, the base 14, the semiconductor element 16, the interconnect members 18, the first bonding layer 22A, the second bonding layer 22B, and the third bonding layer 22C.

(Method of Forming Sealing Layer)

The sealing layer 20 is formed typically by filling, into the sealing space 24A, a liquid glass ($SiO_2$) having dispersed therein a large number of insulating nanoparticles 54, and then allowing the liquid glass to cure.

The sealing layer 20 may alternatively be formed by filling the insulating paste described in JP-B1-5281188 into the sealing space 24A, and then allowing the insulating paste to cure. Among the insulating pastes described in JP-B1-5281188, the insulating paste particularly employed in this invention uses $SiO_2$ insulating nanoparticle as the insulating nanoparticle, and additionally contains a Si particle and a liquid organic Si compound.

The liquid glass and the insulating paste may typically be cured by heating, preferably in a vacuum atmosphere, in the temperature range from 130° C. to 150° C. The cured product is preferably cooled thereafter under pressure. This process successfully densifies the sealing layer 20, and enhances the adhesiveness to the case 12, the base 14, the semiconductor element 16, the interconnect members 18, the first bonding layer 22A, the second bonding layer 22B, and the third bonding layer 22C.

In short, the sealing layer 20 is a fired product made from the liquid glass or the insulating paste.

Since the sealing layer 20 is configured by a composite structure having combined therein the insulating nanoparticles 54 and the amorphous silica matrix 56 composing the glass, so that the sealing layer 20 will have an increased volume and can form a highly reliable layer without void, gap, crack or other defects. In fact, the volume increases by several percent after the reactive forming, and this successfully avoids production of void, gap, crack or the like.

According to the sealing layer 20 of this embodiment, obtainable effects are as follows:

(a) excellent physical/chemical strength, and excellent heat resistance characterized by a heat resisting temperature exceeding 250° C., causing neither separation nor wire breakage even up to 600° C. or around;

(b) easy and exact formation of the sealing layer 20; and (c) high reliability due to absence of void, gap, crack or other defects inside the sealing layer 20.

As has been described above, the sealing layer 20 of this embodiment is an insulating material layer having an excellent physical/chemical strength, and is durable even above 250° C.

The sealing layer 20 is therefore prevented from degrading by heat, even when the semiconductor element 16 is incorporated in the semiconductor device 10 to be used as a power device, and even when the operating temperature exceeds 150° C. as a result of large current flow or high speed operation. This is advantageous in terms of keeping the semiconductor element 16 durable, while allowing it to demonstrate its full performance.

This invention is therefore advantageous in terms of improving the performances and keeping the durability of the inverter used for railway vehicle, electric vehicle, power generating facility and so forth, and in terms of considerably reducing accidents in railway vehicle, electric vehicle, power generating facility and so forth, caused by failure of the power device.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A semiconductor device comprising:
a semiconductor element;
a case that houses the semiconductor element;
a base that supports the semiconductor element inside the case, and functions as a heat radiation member that dissipates heat generated in the semiconductor element;
an interconnect member that is provided inside the case, and is electrically connected to the semiconductor element; and
a sealing layer that is filled in the case so as to embed the semiconductor element and the interconnect member,
the sealing layer being configured to have a nanocomposite structure that comprises insulating nanoparticles composed of $SiO_2$ and having a particle size of 1 μm or smaller, and an amorphous silica matrix that fills up the space around the particles without voids and gaps.

2. The semiconductor device of claim 1, wherein the semiconductor element configures a power device.

* * * * *